United States Patent
De Raad et al.

(10) Patent No.: US 9,704,851 B2
(45) Date of Patent: Jul. 11, 2017

(54) SILICON CONTROLLED RECTIFIER

(71) Applicant: NXP B.V., Eindhoven (NL)

(72) Inventors: Gijs Jan De Raad, Bemmel (NL); Guido Wouter Willem Quax, Utrecht (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/179,162

(22) Filed: Jun. 10, 2016

(65) Prior Publication Data

US 2017/0012037 A1   Jan. 12, 2017

(30) Foreign Application Priority Data

Jul. 7, 2015  (EP) .................................. 15175743

(51) Int. Cl.
*H01L 29/74* (2006.01)
*H01L 27/02* (2006.01)

(52) U.S. Cl.
CPC ...... *H01L 27/0262* (2013.01); *H01L 27/0285* (2013.01); *H01L 27/0292* (2013.01); *H01L 29/7436* (2013.01)

(58) Field of Classification Search
CPC .............. H01L 27/0262; H01L 27/0285; H01L 27/0292; H01L 29/74
USPC ......................................................... 257/146
See application file for complete search history.

(56) References Cited

U.S. PATENT DOCUMENTS

| 5,465,189 A | 11/1995 | Polgreen et al. |
| 5,754,381 A | 5/1998 | Ker |
| 6,172,404 B1 | 1/2001 | Chen et al. |
| 8,283,727 B1 | 10/2012 | Walker et al. |
| 2003/0052332 A1 | 3/2003 | Chen |
| 2003/0234405 A1 | 12/2003 | Lai et al. |
| 2014/0138735 A1* | 5/2014 | Clarke ................ H01L 29/0692 257/124 |

OTHER PUBLICATIONS

Amerasekera et al., "Designing Latchup Robustness in a 0.35 um Technology," IEEE/IRPS, 1994, pp. 280-285.

(Continued)

*Primary Examiner* — Tu-Tu Ho

(57) ABSTRACT

A silicon controlled rectifier, an electrostatic discharge (ESD) protection circuit including the silicon controlled rectifier and an integrated circuit including the silicon controlled rectifier or ESD protection circuit. The silicon controlled rectifier includes a first region having a first conductivity type and a second region having a second conductivity type located adjacent the first region in a semiconductor substrate. A junction is formed at a boundary between the first region and the second region. Contact regions of the first conductivity type and the second conductivity type located in each of the first region and the second region. A further contact region of the second conductivity type is located in the second region, in between the contact region of the first conductivity type and the junction. The further contact region and the contact region of the second conductivity type in the second region are connected together for biasing the second region.

19 Claims, 6 Drawing Sheets

(56) References Cited

OTHER PUBLICATIONS

Hu et al., "A CMOS Structure with High Latchup Holding Voltage," IEEE Electron Device Letters, vol. EDL-5, No. 6, Jun. 1984, pp. 211-214.

Lou et al., "A Novel and Robust Un-Assisted, Low-Trigger and High-Holding Voltage SCR (uSCR) for Area-Efficient On-Chip ESD Protection," IEEE, 2007, pp. 605-607.

Fan et al., "A Novel Low Voltage Base-Modulated SCR ESD Device with Low Latch-up Risk," EOS/ESD Symposium 09, 2009, 10 pages.

* cited by examiner

SILICON CONTROLLED RECTIFIER

CROSS-REFERENCE TO RELATED APPLICATIONS

This application claims priority under 35 U.S.C. §119 to European Patent application no. 15175743.2, filed on 7 Jul. 2015, the contents of which are incorporated by reference herein.

FIELD OF THE INVENTION

This invention relates to a silicon controlled rectifier, to an electrostatic discharge (ESD) protection circuit including the silicon controlled rectifier and to an integrated circuit including the silicon controlled rectifier or ESD protection circuit.

BACKGROUND OF THE INVENTION

Silicon Controlled Rectifiers (SCRs) are popular as electrostatic discharge (ESD) protection devices because of their capacity for handling large ESD currents while needing only a small amount of silicon area. However, their main drawback is that, once activated, the voltage across the SCR needs to be decreased below its "hold voltage" to make the SCR shut down. For short-base SCR's this hold voltage may lie in the range of 2-3 V. If such an SCR is implemented in a product that operates in the 3-5 V range, the device is prone to latch-up, which generally leads to device failure.

A long-base SCR is an SCR engineered to have its holding voltage above the intended operating voltage of a product. The high holding voltage is achieved by placing the NPN emitter and PNP emitter of the device further apart. A disadvantage of a device of this kind is that its operating voltage during an ESD event is typically higher than for a short-base SCR, and this may be harmful to the integrated circuit (IC) that is being protected. If an ESD device of this type is used, the rest of the IC needs to be carefully engineered to make sure it can handle the higher operating voltage. This process is time consuming, sometimes requires special software tools, and can introduce ESD-failures if despite all precautions a weak spot is overlooked. Another disadvantage is that long-base SCR's can may only be used on low-ohmic substrate wafers. For IC's in high-voltage processes, or RF-processes where typically high-ohmic substrate wafers are used, long-base SCR's usually have a holding voltage well below 5V, and accordingly cannot be used as protection devices for products operating at 5V.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a silicon controlled rectifier comprising:

a first region having a first conductivity type located in a semiconductor substrate;

a second region having a second conductivity type located adjacent the first region in the semiconductor substrate, whereby a junction is formed at a boundary between the first region and the second region;

a contact region of the first conductivity type and a contact region of the second conductivity type located in the first region, wherein the contact region of the second conductivity type is located between the contact region of the first conductivity type and said junction;

a contact region of the first conductivity type and a contact region of the second conductivity type located in the second region, wherein the contact region of the first conductivity type is located between the contact region of the second conductivity type and said junction; and a further contact region of the second conductivity type, wherein the further contact region is located in the second region in between the contact region of the first conductivity type and said junction, wherein the further contact region and the contact region of the second conductivity type in the second region are connected together for biasing the second region.

The provision of the further contact region of the second conductivity type located in the second region in between the contact region of the first conductivity type and the junction may increase the holding voltage of the silicon controlled rectifier. This may be achieved in a manner that need not lead to an increased operating voltage during an ESD event (unlike long-base SCRs of the kind mentioned hereinabove). The increased holding voltage may allow latch-up to be prevented.

In general, SCRs may be operated in a self-biased mode, or they may be driven by an external bias. A conventional SCR operating in self-biased mode has two contacts of both conductivity types located in a region of a first conductivity type connected to a first potential, and two contacts of both conductivity types located in a region of the second conductivity type connected to a second potential. The difference between these two potentials is sufficient to sustain the SCR-action once the SCR has been activated. This is equivalent to stating that the difference between the first potential and the second potential exceeds the holding voltage. Once activated, the difference between the first potential and the second potential needs to be reduced below the holding voltage for the SCR to shut down.

It is envisaged that some embodiments of the present disclosure may be externally biased using the further contact region of the second conductivity type located in the second region. In such examples:

the contact region of the first conductivity type and the contact region of the second conductivity type located in the first region may be connected to a first potential;

the contact region of the first conductivity type located in the second region may be connected to a second potential; and the further contact region (and optionally also the contact region of the second conductivity type in the second region) may be connected to a third potential (for providing the external bias).

In such examples, in use, the difference between the first potential and the second potential may be equal to the voltage drop across the silicon controlled rectifier, and may be smaller than the holding voltage of the device. If the first conductivity type is p-type and the second conductivity type is n-type, the silicon controlled rectifier may be driven by lowering the third potential with respect to the second potential by drawing current from the contact region of the second conductivity type in the second region. If the first conductivity type is n-type and the second conductivity type is p-type, the SCR may be driven by raising the third potential with respect to the second potential by injecting current into the contact region of the first conductivity type in the first region. In either case, the third potential may be selected to fall somewhere between the first potential and the second potential. Provided that the difference between first potential and the second potential is less than the hold voltage of the silicon controlled rectifier, the silicon controlled rectifier may be shut down by ceasing to draw current from, or ceasing to inject current into, the node connected to the third potential. In some embodiments therefore, the addition of the further contact region of second conductivity type in the second region may raise the holding voltage of the silicon controlled rectifier to a level that is not expected to occur either during normal operation of a circuit or product that the silicon controlled rectifier provides ESD protection for, or indeed during an ESD event.

The further contact region may have an area $A_{fc}$, and the contact region of the first conductivity type located in the second region may have an area $A_e$. In some examples, the ratio of the areas of these contact regions may be in the range $0.25A_e \leq A_{fc} \leq 5.0A_e$. It is also envisaged that $A_{fc}$ may be larger than $A_e$. For instance, in some examples, $A_e < A_{fc} \leq 5.0A_e$.

Embodiments of this disclosure may allow the holding voltage of the device to be increased without the need to provide additional contact regions (i.e. in addition to the contact regions mentioned above (including the further contact region). For instance, in some examples, the first region does not include any extra contact regions in addition to the contact region of the first conductivity type and the contact region of the second conductivity type. This arrangement may allow the contact region of the second conductivity type located in the first region and the contact region of the first conductivity type in the second region to be placed relatively close together (since space for additional contact regions in the first region need not be provided), whereby the operating voltage of the device may be reduced and whereby a turn-on time of the device may be faster. For instance, the contact region of the second conductivity type located in the first region and the contact region of the first conductivity type in the second region may be separated by no more than 4 μm or even by no more than 2.5 μm.

In some examples, isolation regions may be located at a surface of the semiconductor substrate for separating the contact regions of the first and second regions.

The first conductivity type may be p-type and the second conductivity type may be n-type. However, it is also envisaged that the first conductivity type may be n-type and the second conductivity type may be p-type.

Embodiments of this disclosure may be used in a wide range of applications. In contrast to conventional devices such as long-based silicon controlled rectifiers, a silicon controlled rectifier according to an embodiment of this disclosure may be used in applications that require a high-ohmic substrate (e.g. high-voltage processes, or RF-processes). In some examples, the semiconductor substrate has an electrical resistivity $\rho > 10$ Ω·cm at 300° K.

According to another aspect of the disclosure there is provided an electrostatic discharge protection circuit comprising:

the silicon controlled rectifier of any preceding claim connected between a first node and a second node of the circuit such that the contact region of the first conductivity type in the second region is connected to the first node and the contact region of the first conductivity type and the contact region of the second conductivity type located in the first region are both connected to the second node;

a first MOSFET connected in series with a second MOSFET between the first node and the second node, wherein the first and second MOSFETs have channels of opposite conductivity type, and wherein the further contact region and the contact region of the second conductivity type in the second region are connected to a node located between said series-connected MOSFETs; and a trigger circuit having an output connected to the gates of the first and second MOSFETs for applying a control signal to switch the MOSFETs during an electrostatic discharge event.

The arrangement of the first and second MOSFETs and the trigger circuit may provide for effective triggering of the silicon controlled rectifier while allowing the biasing of the second region noted above to be implemented.

The tem "MOSFET" is used herein generically, to refer to any Metal Insulator Semiconductor Field Effect Transistor, where the gate insulation may, for instance, comprise an oxide.

In some examples, the trigger circuit may be operable to switch on the first MOSFET in the absence of an electrostatic discharge event, whereby the further contact region and the contact region of the second conductivity type in the second region are both shorted to the potential at the contact region of the first conductivity type in the second region. This may allow the trigger circuit to keep the silicon controlled rectifier deactivated when there is no electrostatic discharge event.

The trigger circuit may be operable to switch on the second MOSFET during an electrostatic discharge event. In this way, the further contact region and the contact region of the second conductivity type in the second region may both be shorted to the potential at the second node (e.g. ground) for triggering the silicon controlled rectifier.

The first MOSFET may be operable to switch on to deactivate the silicon controlled rectifier after an electrostatic discharge event has passed. In this way, the first MOSFET may provide latch-up protection for the silicon controlled rectifier.

The first MOSFET may be a PMOS transistor, while the second MOSFE,T may be an NMOS transistor (e.g. where the first conductivity type is p-type). However, it is also envisaged that the first MOSFET may be an NMOS transistor, while the second MOSFET may be a PMOS transistor (e.g. where the first conductivity type is n-type).

The first and second nodes may be power rails. For instance, the first node may be a power supply rail. The second node may be a rail held at a lower voltage than the power rail of the first node (e.g. ground).

According to a further aspect of the disclosure there is provided an integrated circuit comprising the silicon controlled rectifier of any of claims 1 to 9 or electrostatic discharge protection circuit of any of claims 10 to 14.

BRIEF DESCRIPTION OF THE DRAWINGS

Embodiments of the present disclosure will be described hereinafter, by way of example only, with reference to the accompanying drawings in which like reference signs relate to like elements and in which.

DETAILED DESCRIPTION

Embodiments of the present disclosure are described in the following with reference to the accompanying drawings.

Figure 1:
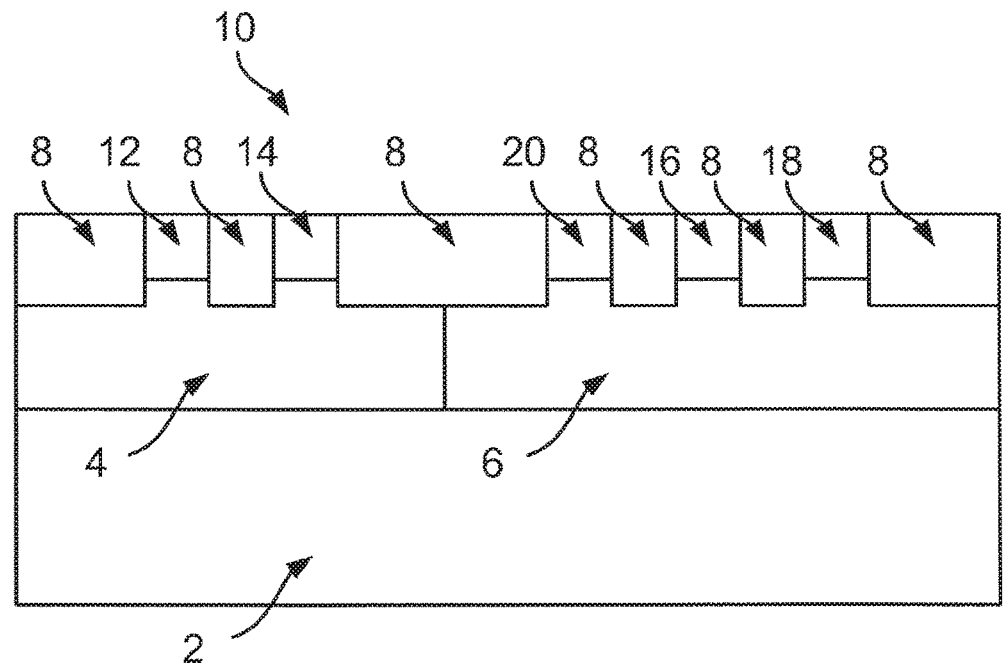
FIG. 1 shows a silicon controlled rectifier in accordance with an embodiment of the present disclosure.

FIG. 1 shows a silicon controlled rectifier 10 in accordance with an embodiment of the present disclosure. The silicon controlled rectifier 10 may be provided in a semiconductor substrate 2. The substrate may, for instance, be a silicon substrate 2. The substrate may be doped to have a first conductivity type, which may be either p-type or n-type.

The silicon controlled rectifier 10 includes a first region 4 and a second region 6 located in the substrate 2. The second region 6 is located adjacent the first region 4. Each region 4, 6 may comprise a doped semiconductor material such as doped silicon. The first region 4 is doped to have a first conductivity type and the second region 6 is doped to have a second conductivity type (where the first and second conductivity types are different conductivity types). In the following examples, the first conductivity type is p-type, while the second conductivity type is n-type. However, it is envisaged that the first conductivity type may be n-type, while the second conductivity type is p-type.

The first region 4 and the second region 6 may comprise wells formed in the surface of the substrate 2, e.g. using ion implantation and diffusion techniques.

Since the first region 4 and the second region 6 have different conductivity types, a pn junction is formed at a boundary between them.

The silicon controlled rectifier 10 includes a number of contact regions, which are located in the first region 4 and the second region 6. In general, the contact regions may be doped regions formed in a surface of the substrate. These doped regions typically may have a doping level that is higher than the doping level of the first 4 and second 6 regions. The doped regions forming the contact regions may be separated from each other by isolation regions 8. These isolation regions may be formed from dielectric (typically an oxide) and may, for instance, comprise shallow trench isolation (STI).

A contact region 12 of the first conductivity type and a contact region 14 of the second conductivity type may be located in the first region 4. The contact region 14 may be located between the contact region 16 and the junction formed at the boundary between the first region 4 and the second region 6. In use, the contact region 14 (which, in this example, is n-type) may form a cathode of the silicon controlled rectifier 10. As is well known in the art of ESD protection devices, a silicon controlled rectifier may be viewed as a pair of interconnected bipolar transistors (one of which is an NPN transistor and one of which is a PNP transistor), which are triggered by avalanching at the junction between a p-type and an n-type region during an ESD event to shunt the ESD current. In the present example, the contact region 14, which is n-type, may form the emitter of an NPN bipolar transistor of the silicon controlled rectifier. The contact region 14 may form a contact for applying a potential to the first region 4.

A contact region 16 of the first conductivity type and a contact region 18 of the second conductivity type may be located in the second region 6. The contact region 16 may be located between the contact region 18 and the junction formed at the boundary between the first region 4 and the second region 6. In use, the contact region 16 (which in this example is p-type) may form an anode of the silicon controlled rectifier 10. In the present example, the contact region 16, which is p-type, may form the emitter of a PNP bipolar transistor of the silicon controlled rectifier. The contact region 18 may form a contact for applying a potential to the second region 6.

A further contact region 20 is located in the second region 6. The further contact region 20 is of the second conductivity type, which in the present example is n-type. Note that the further contact region 20 has the same conductivity type as the contact region 18. The further contact region 20 may be located in between the contact region 16 and the junction formed at the boundary between the first region 4 and the second region 6.

The further contact region 20 and the contact region 18 are connected together so that a common potential may be applied to them both. As will be described below, the further contact region 20 may be used to apply a bias to the second region 6, which may have the effect of increasing the holding voltage of the silicon controlled rectifier 10.

Figure 2:
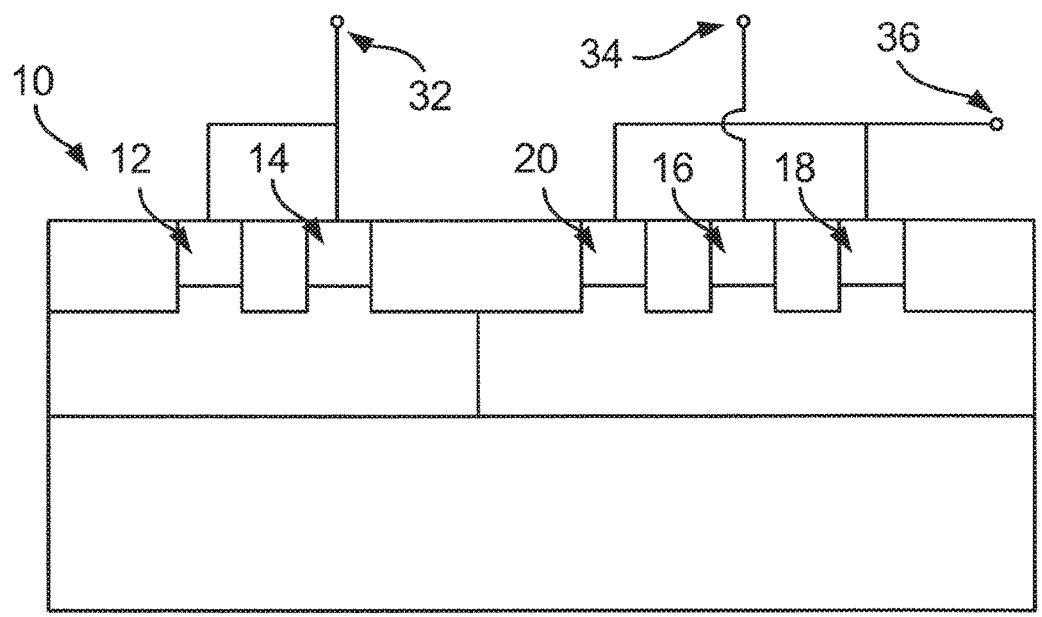
FIG. 2 shows an example of how the contacts of a silicon controlled rectifier in accordance with an embodiment of the present disclosure may be connected.

FIG. 2 shows an example of how the contact regions of the silicon controlled rectifier 10 of FIG. 1 may be connected.

In FIG. 2, the contact region 18 and the further contact region 20 are both connected to an external potential 36 for biasing the second region 6. The contact region 16 (which, as noted above, may form the anode of the silicon controlled rectifier 10) may be connected to a first node 34. The first node 34 may, for instance, be an I/O pin, ESD rail or power supply rail.

In FIG. 2 the contact regions 12, 14 of the first region 4 may both be connected to a second node 32. The second node 32 may, for instance, be a power supply rail at a potential that is lower than that at the first node 34. In some examples, the power supply rail of the second node 32 may be a ground rail.

As described herein, the provision of the further contact region 20 located in the second region 6 may increase the holding voltage of the silicon controlled rectifier 10. The increased holding voltage may allow latch-up to be prevented.

The increase of the holding voltage may result from the biasing of the second region 6 using a potential that is applied to the further contact region 20. This is explained herein below in the context of a device of the kind shown in FIGS. 1 and 2, in which the first conductivity type is p-type and the second conductivity type is n-type. It will be appreciated that the mechanisms described also apply analogously to examples where the first conductivity type is n-type and the second conductivity type is p-type.

Where an external bias is used (e.g. as per FIG. 2), the potential applied using the further contact 20 may pull down the second region 6 so that an internal bias is formed between the contact region 16 (which forms a PNP-emitter of the silicon controlled rectifier, as noted above) and the second region 6. The contact region 16 accordingly injects holes into the silicon controlled rectifier, which may make their way to the adjacent first region 4 (the holes drift to the low potential at the first region 4) and which subsequently leave the silicon controlled rectifier 10 through the contact region 12.

If the current through the first region 4 becomes sufficiently large, a voltage drop across the silicon just beneath the contact region 12 may develop and the potential of most of the first region 4 (e.g. all of the first region 4 except the area immediately below the contact region 12) may be lifted. This may put a voltage drop across the contact region 14 (which, as noted above, forms an NPN emitter of the silicon controlled rectifier 10) and the first region 4. This may cause the contact region 14 to inject electrons, which may turn the silicon controlled rectifier 10 on fully. The magnitude of the electron current passing through the contact region 12 and the further contact region 20 and/or the contact region 18 may depend partly on the bias current that pulls the second region 6 down, and partly on the overall voltage drop between the contact region 14 and the contact region 16. With only the overall voltage drop between contact region 14 and the contact region 16 (and with a pull-down on the second region 6 absent) the hole current through the contact region 12 and the electron current through the further contact region 20 and/or the contact region 18 bias the contact region 14 and the contact region 16 insufficiently to compensate for the losses of electrons and holes (e.g. lost due to recombination or due to charge carriers leaving the device). Therefore, in this state the SCR action may only be sustained in the presence of an overall voltage between contact region 14 and the contact region 16, and a pull-down current on the second region 6.

The presence of the further contact region 20 may increase the loss of electrons in the silicon controlled rectifier 10 (assuming again that the first conductivity type is p-type, while the second conductivity type is n-type). Accordingly, in the absence of an external bias, a larger overall voltage between contact region 14 and the contact region 16 is required to generate the internal biases needed to keep the SCR action going. Thus, the presence of the further contact region 20 may increase the holding voltage of the silicon controlled rectifier 10.

The further contact region 20 may have an area $Af_c$, and the contact region 16 may have an area $A_e$. The area may be defined by the area occupied by each contact region in the second region 6, when viewed from above the substrate. In some examples, the ratio of the areas of these contact regions may be in the range $0.25A_e \leq A_{fc} < 5.0A_e$. It is envisaged that $A_{fc}$ may be made larger than $A_e$, thereby further to ease the loss of electrons in the silicon controlled rectifier 10 as explained above. For instance, in some examples, $A_e < A_{fc} \leq 5.0A_e$. It is envisaged that the effect of increasing the size of $A_{fc}$ may saturate at values of $A_{fc}$ larger than the stated range.

Embodiments of this disclosure may allow the holding voltage of the silicon controlled rectifier 10 to be increased without the need to provide extra contact regions in the first region 4. Thus, in some examples, the first region 4 does not include any further contact regions in addition to the contact region 12 and the contact region 14.

This arrangement may allow the contact region 14 and the contact region 16 to be placed relatively close together (since space for additional contact regions in the first region 4 need not be provided). For instance, the contact region 14 and the contact region 16 may be separated by no more than 4.0 µm or even by no more than 2.5 µm. The relative closeness of the contact region 14 and the contact region 16 may allow a relatively low operating voltage and provide for fast turn-on times.

Embodiments of this disclosure may be used in a wide range of applications. In contrast to conventional devices such as long-based silicon controlled rectifiers, a silicon controlled rectifier 10 according to an embodiments of this disclosure may be used in applications that require a high-ohmic substrate (e.g. high-voltage processes, or RF-processes). In some examples, the semiconductor substrate has an electrical resistivity $\rho > 10$ Ω·cm at 300° K. Notwithstanding this, it is envisaged that embodiments of this disclosure may be used in applications that require a low-ohmic substrates (e.g. having resistivity $\rho < 0.1$ Ω·cm at 300° K.

Figure 3A:
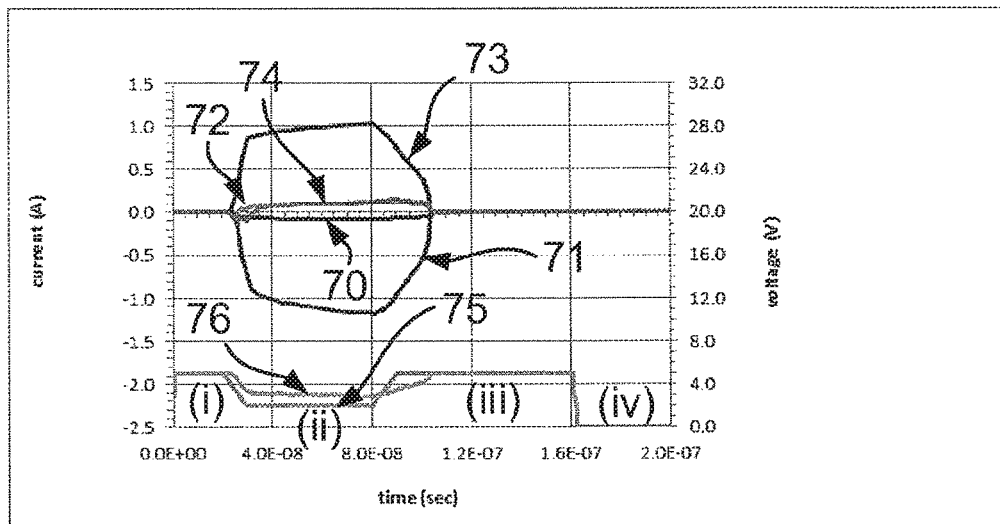
FIGS. 3A and 3B compare simulation results obtained for a silicon controlled rectifier in accordance with an embodiment of the present disclosure with those for a silicon controlled rectifier which does not include a further contact region of kind described herein.
Figure 3B:
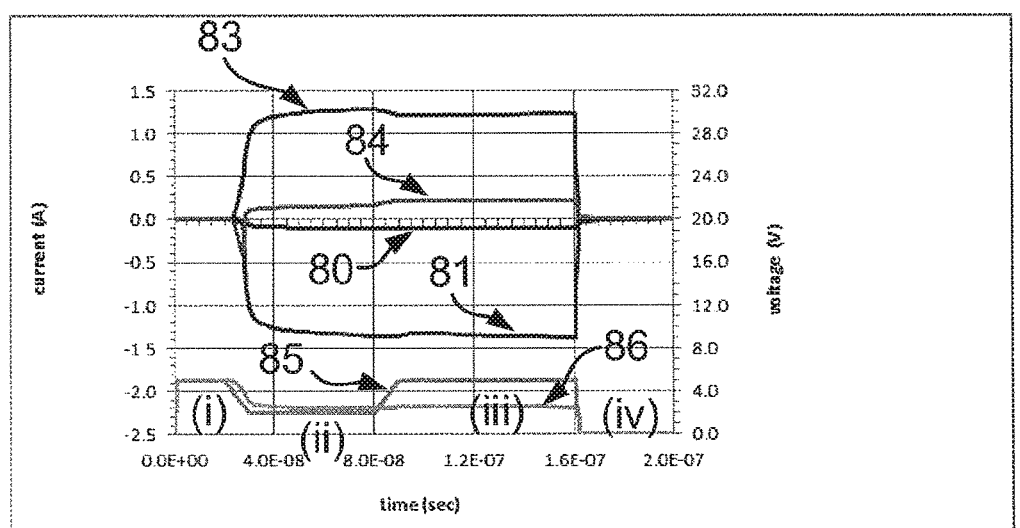

FIG. 3 compares simulation results obtained for a silicon controlled rectifier in accordance with an embodiment of the present disclosure (shown in FIG. 3A) with those for a silicon controlled rectifier (shown in FIG. 3B), which does not include a further contact region 20 of kind described above. The simulations were performed assuming a high-ohmic silicon substrate having a Boron doping level of around $10^{15}$ cm$^{-3}$. Similar simulation results have been achieved for a low-ohmic substrate.

The various plots in FIGS. 3A and 3B are summarised in Table 1 below. In relation to FIG. 3, references are made to the example shown in FIG. 1, although again the plots in FIG. 3B relate to a silicon controlled rectifier that does not include a further contact region 20. Comparison of FIGS. 3A and 3B allows the effect of providing the further contact region 20 to be demonstrated.

TABLE 1

Summary of Plots in FIGS. 3A and 3B.

| FIG. | Reference Numeral | Description |
|---|---|---|
| 3A | 70 | Current at contact region 12 |
| 3A | 71 | Current at contact region 14 |
| 3A | 72 | Current at further contact region 20 |
| 3A | 73 | Current at contact region 16 |
| 3A | 74 | Current at contact region 18 |
| 3A | 75 | Voltage applied to contact region 18 and further contact region 20 |
| 3A | 76 | Voltage applied at contact region 16 |
| 3B | 80 | Current at contact region 12 |
| 3B | 81 | Current at contact region 14 |
| 3B | 83 | Current at contact region 16 |
| 3B | 84 | Current at contact region 18 |
| 3B | 85 | Voltage applied to contact region 18 |
| 3B | 86 | Voltage applied at contact region 16 |

FIGS. 3A and 3B, the simulated pulses included four phases (these are labelled (i), (ii), (iii), (iv) in the Figures):

(i) First, the n-type contact regions of the second region 6 (such as the contact region 18 and the further contact region 20 shown in FIG. 1) and the contact region 16 were simultaneously ramped up to 5V.

(ii) After a delay, the n-type contact regions of the second region 6 were ramped down to 2V. The contact region 16 was maintained at 5V but was connected through a resistor (2Ω). This condition was held for 50 ns and represents the ESD pulse.

(iii) Then, the n-type contact regions of the second region 6 were ramped up to 5V again. This condition was held for 70 ns. It is in this phase of the pulse that it can be seen that the silicon controlled rectifier according to the present disclosure (FIG. 3A) switches itself off, while the silicon controlled rectifier not having the further contact region described herein does not. This difference arose due to the fact that the silicon controlled rectifier not having the further contact region had a lower holding voltage (than the silicon controlled rectifier having the further contact region), which was exceeded by the operating voltage across the silicon controlled rectifier during the test.

(iv) Finally, the n-type contact regions of the second region 6 and the contact region 16 were ramped down to 0V.

Accordingly, the results of FIGS. 3A and 3B demonstrate that a silicon controlled rectifier according to an embodiment of the present disclosure may be less prone to latch-up.

In some examples, a silicon controlled rectifier according to the present disclosure may be provided with a trigger circuit. An example of this is shown in FIG. 4, which shows an electrostatic discharge (ESD) protection circuit 100.

Figure 4:
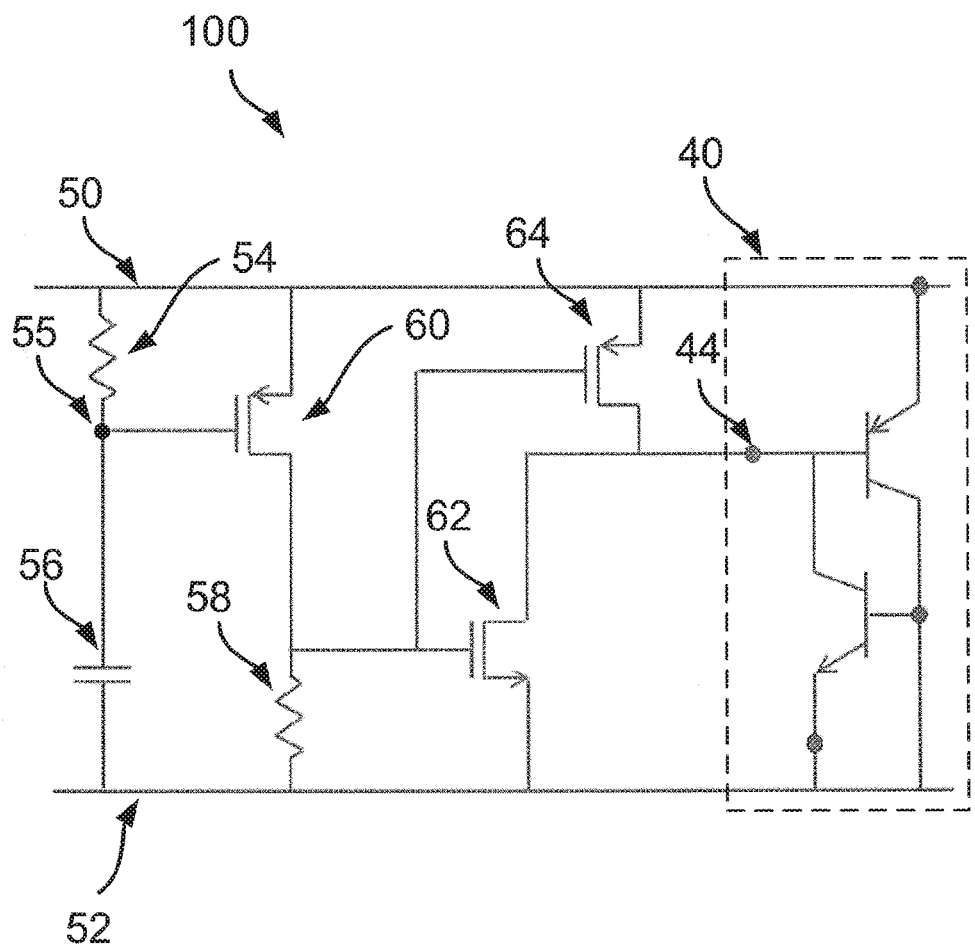
FIG. 4 shows an electrostatic discharge protection circuit that includes a silicon controlled rectifier in accordance with an embodiment of the present disclosure.

In FIG. 4, a silicon controlled rectifier according to the present disclosure (shown generally within the dashed box labelled 40) is connected between a first node and a second node of the circuit 100 such that the contact region 16 is connected to the first node and the contact regions 12, 14 are both connected to the second node. In this example, the first node comprises a power rail 50, while the second node comprises a ground rail 52 of the circuit.

The circuit 100 shown in FIG. 4 also includes a trigger circuit, which in this example is an RC based trigger circuit (it is envisaged that the trigger circuit may instead be DC-level triggered). The trigger circuit includes a resistor 54 connected to the rail 50 and a capacitor 56 connected to the ground rail 52 such that the resistor 54 and capacitor 56 are connected in series between the rail 54 and the ground rail 52. A node 55 located between the resistor 54 and the capacitor 53 is connected to the gate of a PMOS transistor 60. The source of the PMOS transistor 60 is connected to the rail 50. The drain of the PMOS transistor is connected to the ground rail 52 via a biasing resistor 58. The drain of the PMOS transistor 60 is also connected to the gates of a first MOSFET 64 (which in this example is a PMOS shunt transistor) and a second MOSFET 62 (which in this example is a driver NMOS transistor). Note that the first MOSFET 64 and the second MOSFET 64 have channels of opposite conductivity type.

The source of the first MOSFET 64 is connected to the rail 50. The drain of the first MOSFET 64 is connected to the drain of the second MOSFET 62. The source of the second MOSFET 62 is connected to the ground rail 52. The first MOSFET 64 and the second MOSFET 62 are thus connected in series between the rail 50 and the ground rail 52.

A node 44 located between the drain of the first MOSFET 64 and the drain of the second MOSFET 62 is connected to contact region 18 and the further contact region 20 of the silicon controlled rectifier 40.

During normal operation of the circuit (i.e. in the absence of an ESD event), the PMOS transistor 60 is switched off, whereby the gates of the MOSFET 62 and MOSFET 62 match the (low) voltage on the ground rail 52, through the resistor 58. Hence, the MOSFET 62 is on an off state, while the MOSFET 64 is in an on state. This shorts the contact region 18 and the further contact region 20 to the voltage at the contact region 16 (i.e. the voltage on the rail 50, through the node 44 and the first MOSFET 64). This keeps the silicon controlled rectifier 40 deactivated in the absence of an ESD event.

When an ESD event occurs, the voltage at node 55 caused by the event switches on the PMOS transistor 60, whereby the voltage applied to the gates of the first MOSFET 64 and the second MOSFET 62 are pulled high (to the voltage on the rail 50, through the PMOS transistor 60). This switches on the second MOSFET 62, while the first MOSFET 64 is switched off. This shorts the contact region 18 and the further contact region 20 to the (low) voltage at the ground rail 52, which triggers the silicon controlled rectifier 40.

When the ESD event passes, the first MOSFET 64 again switches on, which shorts the contact region 18 and the further contact region 20 to the voltage at the contact region 16 (i.e. the voltage on the rail 50, through the node 44 and the first MOSFET 64), thereby to deactivate the silicon controlled rectifier 40. This arrangement thus provides latch-up protection for the circuit 100.

A circuit of the kind described herein may be provided in an integrated circuit, for providing electrostatic discharge (ESD) protection for the integrated circuit.

FIGS. 5-9 each show an example of a circuit 200 including a silicon controlled rectifier in accordance with various applications of the present disclosure.

Figure 5:
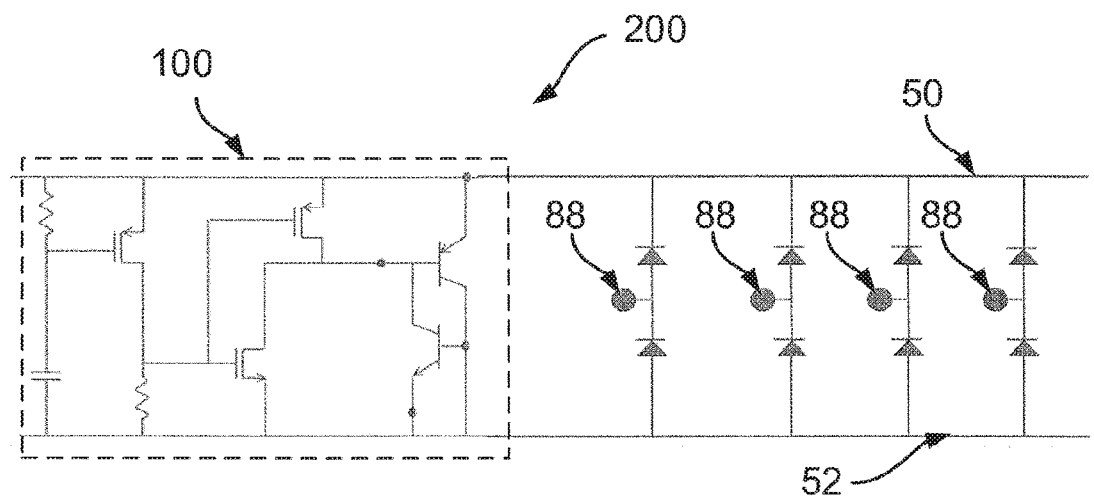
FIGS. 5-9 each show an example of a circuit including a silicon controlled rectifier in accordance with various applications of the present disclosure.

The example circuit 200 in FIG. 5 shows the use of the circuit 100 described above in relation to FIG. 4 as a capacitive rail clamp. In this example, I/O pins 88 are connected in series with a plurality of diodes between the rail 50 and the rail 52. It is envisaged that such a circuit 200 may have a relatively small footprint and stand-by leakage compared to the use of a conventional capacitive rail clamp.

For example, 100 μm wide silicon controlled rectifier may be sufficient to sink a 1.5 A ESD current pulse (equivalent to the peak current of a 2.2 kV HBM pulse) at roughly 5V. The second MOSFET 62 (which, as described above may form a driver NMOS for the circuit 100) may have to sink roughly 0.3 A at 3V, implying that the second MOSFET 62 may need to be around 1,320 μm wide. Achieving similar clamping with conventional capacitive rail clamps would take a rail clamp of 3,300 μm. An underlying assumption is that the maximum allowable voltage at the I/O pins 88 is 7 V. Roughly estimated, a silicon controlled rectifier according to the present disclosure may thus reduce the device footprint and stand-by leakage by a factor 2, if it were used in this way. Latch-up safety may be provided by the fact that the hold voltage of the SCR is larger than the operating voltage of the product.

Figure 6:
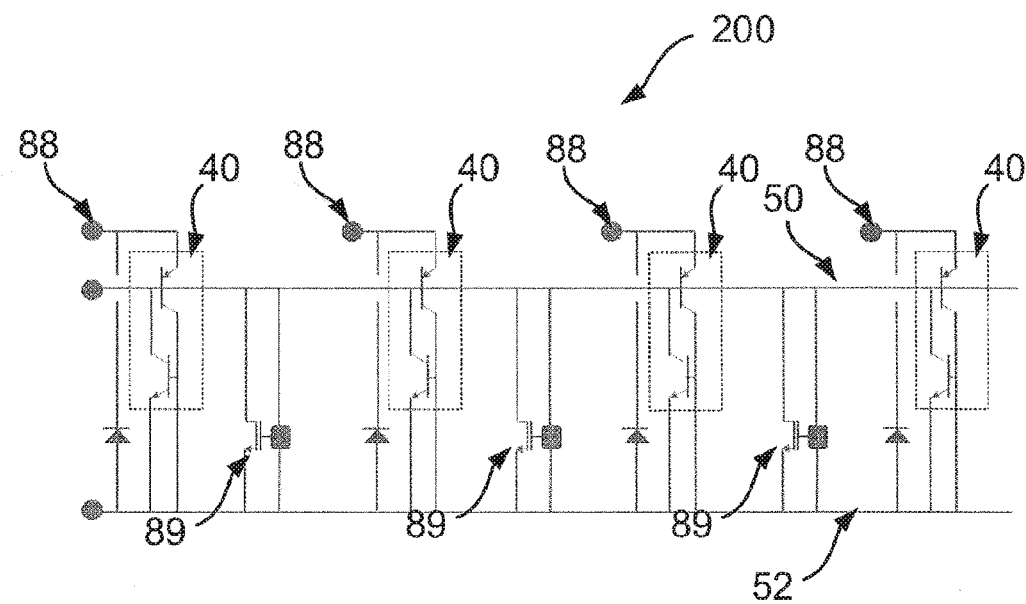

Another example circuit 200 incorporating a silicon controlled rectifier 40 according to the present disclosure is shown in FIG. 6. In this example, the rail 50 doubles as an ESD rail and is protected by one of more mini-bigFETs 89 connected between the rail 50 and the ground rail 52, that clamp the rail 50.

The circuit includes a plurality of I/O pins 88, which in a conventional rail-based ESD protection network would be protected by two diodes. Typically the diode between pin 88 and the rail 50 would be made from a p+ implant inside an nwell-implant. That same diode also exists in an SCR as the PNP base-emitter junction (e.g. junction between the contact region 16 and the underlying second region 6 described above). This may be exploited in circuit 200 shown in FIG. 6. In the circuit shown in FIG. 6, the silicon controlled rectifier 40 may shunt most of an ESD current directly to the rail 52, and can do so at a lower voltage than would be the case in a conventional rail based design using rail clamps and diodes. Typically, diodes are oversized in order to sink a given ESD current at or below a given voltage drop. In accordance with the circuit of FIG. 6, this oversizing may be reduced, leading to a lower pin capacitance.

In common with the example shown in FIG. 5, the SCR-based circuit 200 shown in FIG. 6 may allow for diode-like protections on the I/O pins 88 that are considerably smaller than they otherwise would be. This is because in the circuit of FIG. 6, a majority of the ESD current may bypass the rail clamps (mini-bigFETs 89) protecting the rail 50.

In the circuit 200 of FIG. 6, latch-up safety may be achieved by the hold voltage of the silicon controlled rectifier 40, which is above the operating voltage of the product as described hereinabove, and by the fact that the contact region 16 (e.g. the PNP-emitter) can be accessed directly from the I/O pins 88, and the second region 6

(forming the PNP-base) can be accessed from the rail 50. This may make it possible to force the same voltage on rail 50 and the I/O pin 88. So long as this happens below the hold voltage of the silicon controlled rectifier, this may be sufficient to shut it off.

Figure 7:
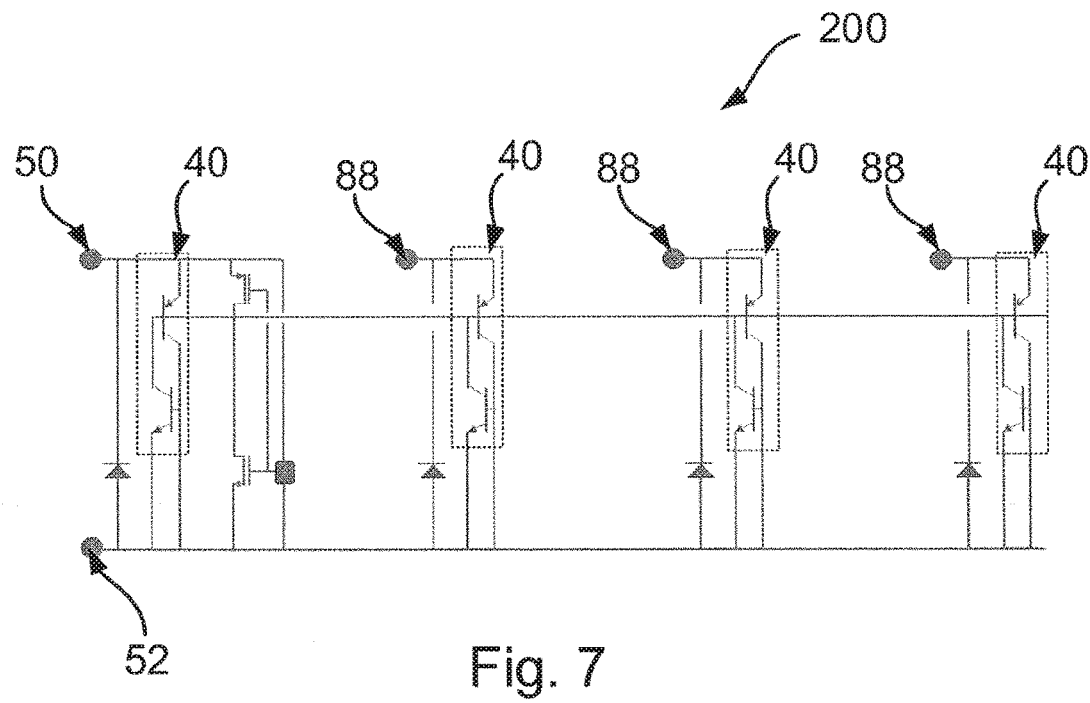

FIG. 7 shows a variant of the circuit shown in FIG. 6, in which the silicon controlled rectifier 40 also provides ESD protection for the rail 50. The device sizes in FIG. 7 may be the same as in FIG. 6, and their advantages in terms of silicon footprint and leakage, may be the same.

However, in the circuit 200 of FIG. 7, the rail clamp driving the silicon controlled rectifiers 40 may be smaller as it may only need to draw the current required to drive the silicon controlled rectifiers 40 (and not also the total ESD current when the rail 50 is zapped).

Again, latch-up safety may be achieved by having the hold voltage of the silicon controlled rectifiers 40 above the operating voltage, as well as by a shunt PMOS transistor that may bias the internal ESD rail to the voltage on the rail 50 at all times when there is a supply voltage (VDD) present and the trigger circuit is not active.

Figure 8:
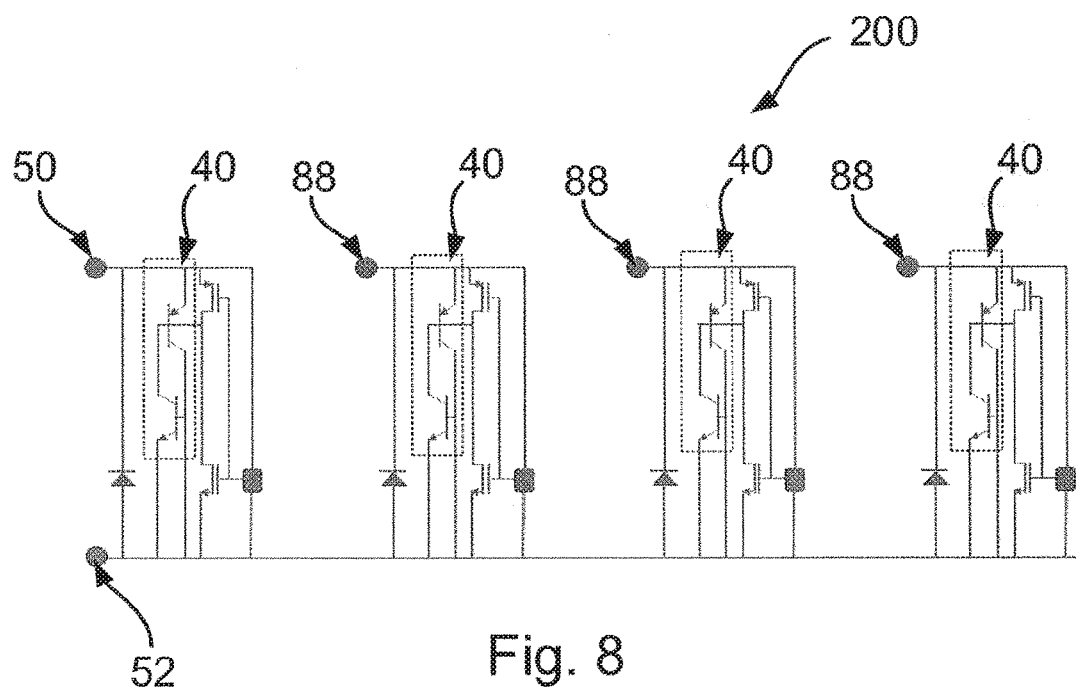

Embodiments of this disclosure may also be used as a pad-based protection. An example of this is shown in FIG. 8. As shown in FIG. 8, the circuit includes a silicon controlled rectifier 40 connected between rail 50 and rail 52. Silicon controlled rectifiers 40 are also connected between I/O pads 88 to provide them with ESD protection. This may be an attractive option for products that cannot tolerate I/O's with a diode to the power supply rail.

Conventional rail based ESD protection networks that use an internal, floating ESD rail can suffer from the fact that the stand-by leakage of the rail clamp(s) serves as bias current for a parasitic PNP inside conventional p+/nwell diodes. In the design of the circuit 200 in FIG. 8, that same parasite is there, but the second region 6 (e.g. local nwell) inside the silicon controlled rectifier 40 is shorted to the pad 88 during normal operation. This means that the parasitic PNP may not amplify standby leakage current in the way it would in a normal floating rail design.

A silicon controlled rectifier according to this disclosure may also be used as an over-voltage protection device in a large output stage of, for example, a switch-mode power supply or class-D audio amplifier. Typically output stages of this type drive inductive loads, and this may result in voltage-spikes on the output each time that the output switches. An over-voltage can result in electrical overstress (EOS) damage to the output stage, typically in a pull-down NMOS transistor thereof.

Figure 9:
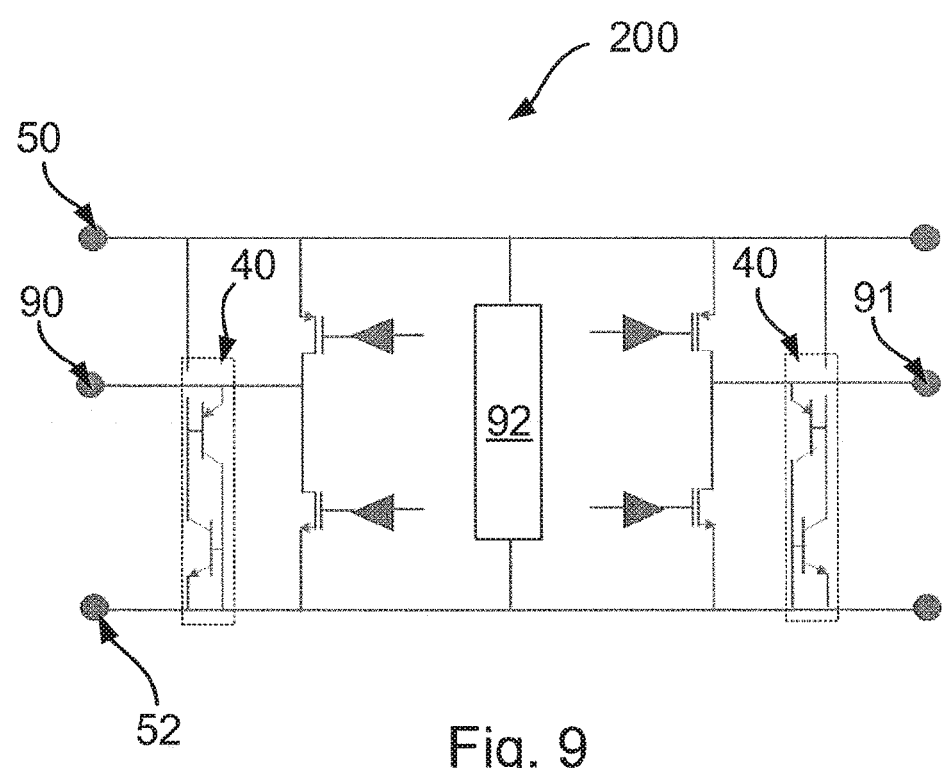

An example of this is shown in FIG. 9. The circuit 200 in FIG. 9 includes a rail 50 (VDD) and a rail 52 (VSS, e.g. a ground rail). The circuit 200 has outputs 90, 91. In FIG. 9, a silicon controlled rectifier 40 is placed between the rail 52, the rail 50 and the output 90. The circuit further includes a conventional rail clamp 92.

An advantage of the circuit shown in FIG. 9 is that it may sink current directly from the output 90 to the rail 52, thus protecting pull-down NMOS transistors of the circuit from damage due to over-voltage. When connected as shown in FIG. 9, the silicon controlled rectifier 40 may activate when the output 90 is raised above the voltage on rail 50 (VDD) by more than one diode voltage, and may stay active so long as this situation persists. Because the silicon controlled rectifier 40 may have a holding voltage that lies above the supply voltage (VDD), lowering the potential of output 90 to VDD itself may be sufficient to switch off the silicon controlled rectifier. Accordingly, latch up safety may be provided.

Accordingly, there has been described a silicon controlled rectifier, an electrostatic discharge (ESD) protection circuit including the silicon controlled rectifier and an integrated circuit including the silicon controlled rectifier or ESD protection circuit. The silicon controlled rectifier includes a first region having a first conductivity type and a second region having a second conductivity type located adjacent the first region in a semiconductor substrate. A junction is formed at a boundary between the first region and the second region. Contact regions of the first conductivity type and the second conductivity type located in each of the first region and the second region. A further contact region of the second conductivity type is located in the second region, in between the contact region of the first conductivity type and the junction. The further contact region and the contact region of the second conductivity type in the second region are connected together for biasing the second region.

Although particular embodiments of the present disclosure have been described, it will be appreciated that many modifications/additions and/or substitutions may be made within the scope of the claimed invention.

The invention claimed is:

1. A silicon controlled rectifier comprising:
   a first region having a first conductivity type located in a semiconductor substrate;
   a second region having a second conductivity type located adjacent the first region in the semiconductor substrate, whereby a junction is formed at a boundary between the first region and the second region;
   a first contact region of the first conductivity type and a second contact region of the second conductivity type located in the first region, wherein the second contact region of the second conductivity type is located between the first contact region of the first conductivity type and said junction;
   a third contact region of the first conductivity type and a fourth contact region of the second conductivity type located in the second region, wherein the third contact region of the first conductivity type is located between the fourth contact region of the second conductivity type and said junction; and
   a further contact region of the second conductivity type, wherein the further contact region is located in the second region in between the third contact region of the first conductivity type and said junction, wherein the third contact region is connected to a first node, wherein the second contact region is connected to a second node, and wherein the further contact region and the fourth contact region of the second conductivity type in the second region are connected together to a third node for biasing the second region.

2. The silicon controlled rectifier of claim 1, wherein the further contact region and the fourth contact region of the second conductivity type in the second region are connected to an external bias for biasing the second region.

3. The silicon controlled rectifier of claim 1, wherein the further contact region has an area $A_{fc}$, wherein the third contact region of the first conductivity type located in the second region has an area $A_e$, and wherein $0.25A_e \leq A_{fc} \leq 5.0A_e$.

4. The silicon controlled rectifier of claim 3, wherein $A_e < A_{fc} \leq 5.0A_e$.

5. The silicon controlled rectifier of claim 1, wherein the first region does not include any further contact regions in addition to the first contact region of the first conductivity type and the second contact region of the second conductivity type.

6. The silicon controlled rectifier of claim 5, wherein the second contact region of the second conductivity type located in the first region and the third contact region of the first conductivity type in the second region are separated by no more than 4 µm.

7. The silicon controlled rectifier of claim 1, further comprising isolation regions located at a surface of the semiconductor substrate for separating the contact regions of the first and second regions.

8. The silicon controlled rectifier of claim 1, wherein the first conductivity type is p-type and the second conductivity type is n-type.

9. The silicon controlled rectifier of claim 1, wherein the substrate has an electrical resistivity $\rho > 10$ $\Omega \cdot cm$ at 300° K.

10. The silicon controlled rectifier of claim 1, wherein the first node provides a first power supply voltage and the second node provides a second power supply voltage, the second power supply voltage is less than the first power supply voltage.

11. The silicon controlled rectifier of claim 1, wherein the second contact region comprises a cathode and the third contact region comprises an anode.

12. The silicon controlled rectifier of claim 1, wherein the first node comprises one of an input/output (I/O) pin, an electrostatic discharge (ESD) rail, and a power supply rail, and the second node comprises a ground rail.

13. The silicon controlled rectifier of claim 1, wherein the third node is configured to switch from a first voltage potential to a second voltage potential during an electrostatic discharge event, wherein the silicon controlled rectifier is triggered when the third node provides the second voltage potential.

14. An electrostatic discharge protection circuit comprising:
   a silicon controlled rectifier comprising:
      a first region having a first conductivity type located in a semiconductor substrate:
      a second region having a second conductivity type located adjacent the first region in the semiconductor substrate, whereby a junction is formed at a boundary between the first region and the second region;
      a first contact region of the first conductivity type and a second contact region of the second conductivity type located in the first region, wherein the second contact region of the second conductivity type is located between the first contact region of the first conductivity type and said junction;
      a third contact region of the first conductivity type and a fourth contact region of the second conductivity type located in the second region, wherein the third contact region of the first conductivity type is located between the fourth contact region of the second conductivity type and said junction; and
      a further contact region of the second conductivity type, wherein the further contact region is located in the second region in between the third contact region of the first conductivity type and said junction, wherein the third contact region is connected to a first node, wherein the first and second contact regions connected together to a second node, and wherein the further contact region and the fourth contact region of the second conductivity type in the second region are connected together to a third node for biasing the second region;
   a first MOSFET connected in series with a second MOSFET between the first node and the second node, wherein the first and second MOSFETs have channels of opposite conductivity type, and wherein the further contact region and the fourth contact region of the second conductivity type in the second region are connected to a node located between said series-connected MOSFETs; and
   a trigger circuit having an output connected to the gates of the first and second MOSFET for applying a control signal to switch the MOSFETs during an electrostatic discharge event.

15. The electrostatic discharge protection circuit of claim 14, wherein the trigger circuit is operable to switch on the first MOSFET in the absence of an electrostatic discharge event, whereby the further contact region and the fourth contact region of the second conductivity type in the second region are both shorted to the potential at the first node via the first MOSFET for keeping the silicon controlled rectifier deactivated.

16. The electrostatic discharge protection circuit of claim 14, wherein the trigger circuit is operable to switch on the second MOSFET during an electrostatic discharge event, whereby the further contact region and the fourth contact region of the second conductivity type in the second region are both shorted to the potential at the second node via the second MOSFET for triggering the silicon controlled rectifier.

17. The electrostatic discharge protection circuit of claim 14, wherein the first MOSFET is operable to switch on to deactivate the silicon controlled rectifier after an electrostatic discharge event has passed.

18. The electrostatic discharge protection circuit of claim 14, wherein the first node comprises a power rail and the second node comprises a ground rail.

19. An integrated circuit comprising:
   a silicon controlled rectifier comprising:
      a first region having a first conductivity type located in a semiconductor substrate;
      a second region having a second conductivity type located adjacent the first region in the semiconductor substrate, whereby a junction is formed at a boundary between the first region and the second region;
      a first contact region of the first conductivity type and a second contact region of the second conductivity type located in the first region, wherein the second contact region of the second conductivity type is located between the first contact region of the first conductivity type and said junction;
      a third contact region of the first conductivity type and a fourth contact region of the second conductivity type located in the second region, wherein the third contact region of the first conductivity type is located between the fourth contact region of the second conductivity type and said junction; and
      a further contact region of the second conductivity type, wherein the further contact region is located in the second region in between the third contact region of the first conductivity type and said junction, wherein the third contact region is connected to a first node, wherein the first and second contact regions connected together to a second node, and wherein the further contact region and the fourth contact region of the second conductivity type in the second region are connected together to a third node for biasing the second region.

* * * * *